(12) United States Patent
Ball

(10) Patent No.: US 7,449,841 B2
(45) Date of Patent: Nov. 11, 2008

(54) CHARGE LIMITED HIGH VOLTAGE SWITCH CIRCUITS

(75) Inventor: Newton E Ball, Anaheim, CA (US)

(73) Assignee: Microsemi Corp.—Analog Mixed Signal Group Ltd., Hod Hasharon (IL)

( * ) Notice: Subject to any disclaimer, the term of this patent is extended or adjusted under 35 U.S.C. 154(b) by 97 days.

(21) Appl. No.: 11/737,172

(22) Filed: Apr. 19, 2007

(65) Prior Publication Data

US 2007/0247006 A1    Oct. 25, 2007

Related U.S. Application Data

(60) Provisional application No. 60/794,500, filed on Apr. 24, 2006.

(51) Int. Cl.
*H05B 41/16*    (2006.01)

(52) U.S. Cl. .................. 315/246; 315/225; 315/291

(58) Field of Classification Search ............ 315/209 R, 315/224–226, 246–227, 287, 291, 307; 323/282, 323/289, 292, 343, 349
See application file for complete search history.

(56) References Cited

U.S. PATENT DOCUMENTS 4,342,956 A * 8/1982 Archer ................... 323/289
4,430,608 A * 2/1984 Nesler ..................... 323/282
5,502,357 A * 3/1996 Kimball ................. 315/209 R
5,907,238 A * 5/1999 Owerko et al. ............. 323/349
6,847,175 B2 * 1/2005 Nerone ..................... 315/224
7,015,654 B1 * 3/2006 Kuhlmann et al. .......... 315/291

* cited by examiner

*Primary Examiner*—David Hung Vu
*Assistant Examiner*—Tung X Le
(74) *Attorney, Agent, or Firm*—Simon Kahn

(57) ABSTRACT

High voltage switches are configured with a junction transistor driven with a transformer coupled AC drive signal in the common base configuration or driven by a capacitor coupled charge pump. The high voltage switches may be configured as half wave or full wave switches wherein the junction transistor is driven during one or both half cycles of the AC drive signal. Bipolar switches that can stand off high DC voltage of either polarity, or that can stand off high AC voltage, are configured from two junction transistors with their bases connected and their emitters connected. These switches may also be driven in full wave or half wave mode, by a transformer or by single or dual capacitive charge pumps. Either NPN or PNP transistors may be used. Example drive circuits, which can be constructed as low voltage integrated circuits, are given for all of the switch types.

20 Claims, 7 Drawing Sheets

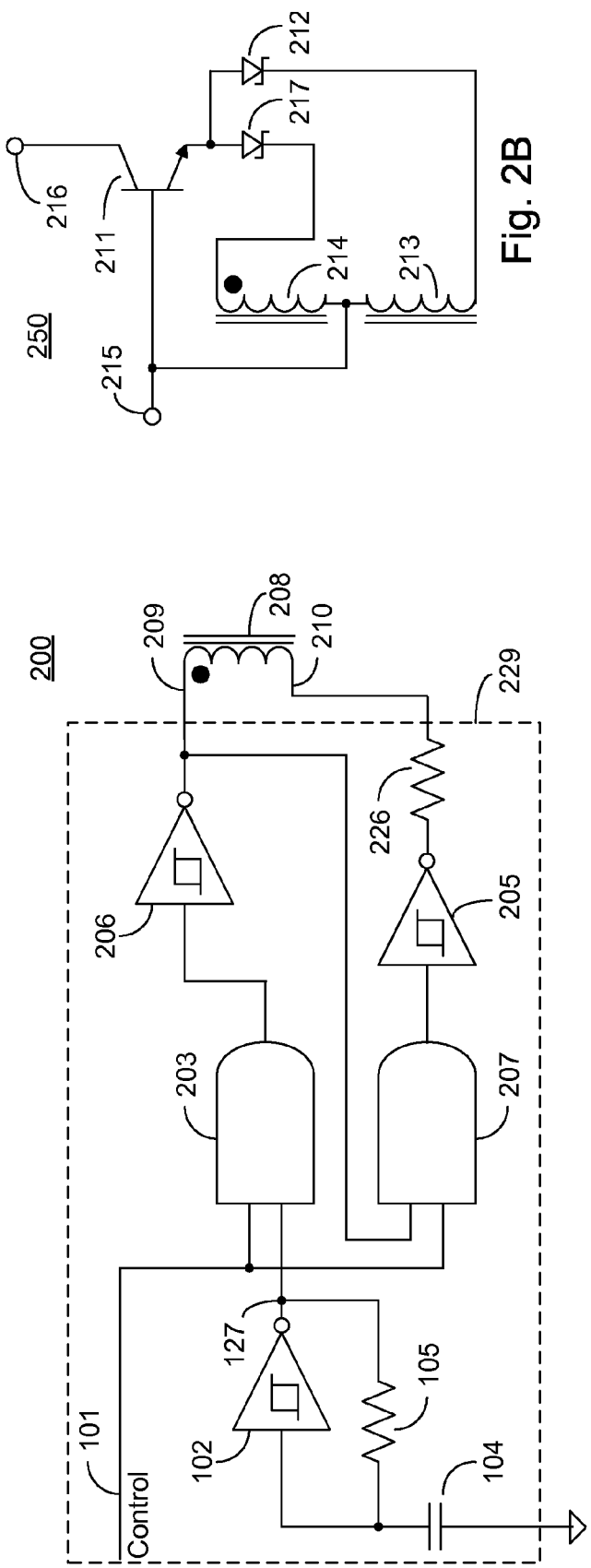
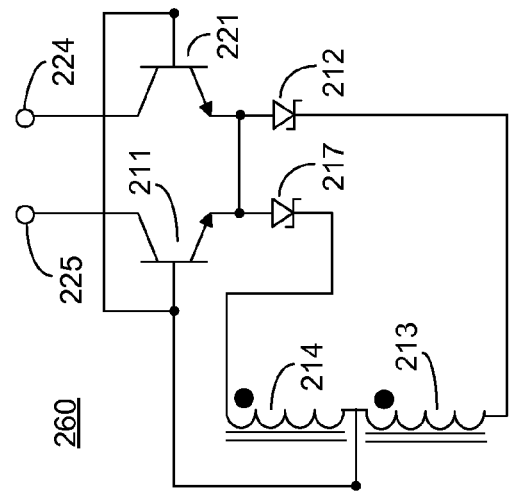
Fig. 2A
Fig. 2B
Fig. 2C

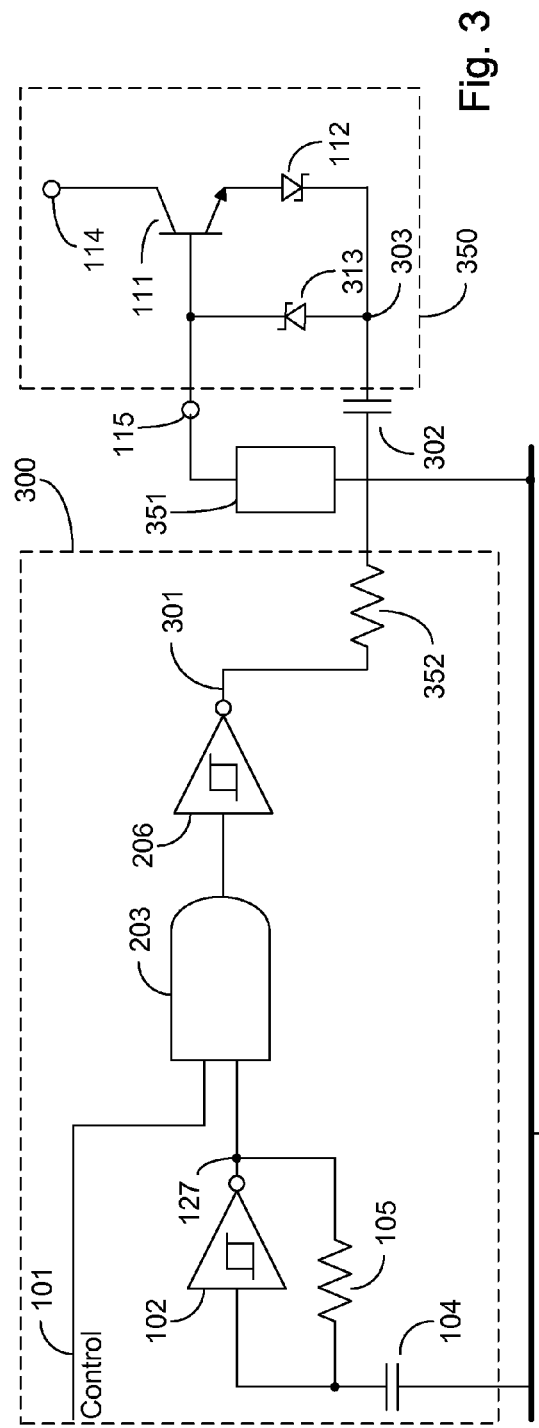
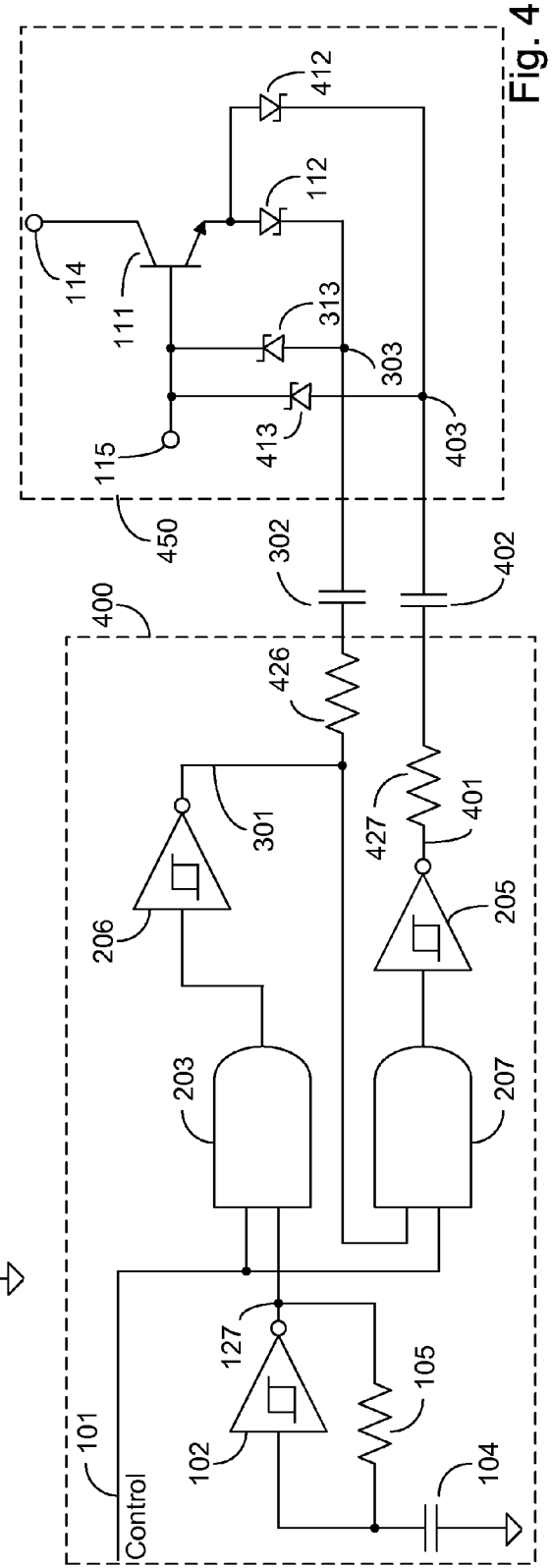

CHARGE LIMITED HIGH VOLTAGE SWITCH CIRCUITS

CROSS REFERENCE TO RELATED APPLICATIONS

This application claims priority from U.S. Provisional Patent Application 60/794,500 filed Apr. 24, 2006 entitled "Charge Limited High Voltage Switch Circuits", the entire contents of which is incorporated herein by reference.

TECHNICAL FIELD

The present invention relates to high voltage electronic switches, and in particular, to high voltage switches employing junction transistors.

BACKGROUND INFORMATION

Electronic switches represent a very great part of the advance in electronics as a whole in the last few decades, replacing metallic contacts in virtually all fast applications. All Pulse Width Modulation [PWM] power circuitry depends on fast electronic switching. At low to moderate supply voltages, typically below 50V, MOSFETs are extremely effective switches. Toward the high end of this range, however, MOSFET based high side switch drivers are problematic and expensive. At 100V and above, MOSFETs usually require 10V of drive voltage, and the conductive channel must be limited in conductivity in order to meet breakdown voltage ratings. Both of these restrictions limit the transconductance [Gm] of the device. A simple junction NPN transistor requires less than one volt to be fully turned on, and by means of beta (carrier multiplication) can achieve very high current densities. The result is a dramatically higher Gm for a device of the same active die area.

Unfortunately, prior art driving means utilizing junction transistors have typically been arranged in a common emitter mode, often requiring separate high side or low side driver stages, and are difficult to drive directly from ordinary low voltage integrated circuits.

SUMMARY OF THE INVENTION

The present invention envisions several ways of driving emitters in common base junction transistor stages that eliminate the need for separate high side and low side driver stages and enables drive directly from ordinary low voltage integrated circuits.

One embodiment of the present invention configures high voltage switches using junction transistors in a common base configuration wherein limited charge is supplied to the base emitter junction to turn on the junction transistors. The emitter circuit is alternating current (AC) driven at a high frequency allowing the emitter to be an open circuit when high voltage switches, configured according to embodiments of the present invention, are gated "off". AC driven means the polarity of the drive signal reverses polarity at its terminals and specifically is meant to include a square wave.

The below embodiments are being described for simplicity of understanding primarily utilizing NPN junction transistors, however this is not meant to be limiting in any way. In each case, a PNP junction transistor may be substituted for the NPN junction transistor without exceeding the scope of the invention by observing the proper polarity of the associated diodes and load voltages.

In one embodiment using AC drivers, a single junction transistor is operated in the half wave mode wherein the base emitter junction is forward biased during one half of the cycle of a square wave signal, transformer coupled across the base emitter junction. The primary winding of the transformer is driven by a square wave AC oscillator signal and the secondary transformer winding, or windings, delivers a limited charge to cause conduction and preferably saturate the junction transistor. A load circuit with a DC voltage source is coupled between the collector and the base of the junction transistor with the positive potential of the voltage source coupled directed to the collector when the junction transistor is an NPN device. A fast recovery diode is coupled in series with the emitter circuit of the NPN transistor. A secondary winding is coupled across the base-emitter junction of the NPN transistor and the fast recovery diode. In this manner, the base emitter junction is forward biased during one half of the drive cycle of the AC oscillator signal and the fast diode is reverse biased when the AC signal reverses polarity, thereby leaving charge stored in the base-emitter diode during the other half of the drive cycle. By selecting a sufficiently high frequency for the AC signal and properly selecting the transformer, enough charge is stored in the base region so that the NPN transistor remains on and conducting during the time the secondary winding reverse biases the fast diode. By gating the AC oscillator signal "on" and "off", the NPN transistor switch is made to conduct, substantially continuously, when the AC signal is gated "on". When the AC signal is gated "off", the emitter circuit is essentially open circuited and the NPN device is able to hold off the high voltage of the voltage source of the load circuit with the breakdown voltage equal to Vcbo, defined as the collector-to-base breakdown with the emitter open circuited, of the junction transistor. In this embodiment, stand off voltage must have a particular polarity, and this embodiment is thus termed a unipolar switch. As explained above, it is understood that a PNP junction transistor may be substituted for the NPN device by reversing the direction of the fast diode and the voltage source in the load circuit.

In another embodiment of the present invention, the secondary of the transformer is configured as a tapped secondary forming a first terminal, a common second terminal, and a third terminal, wherein an equal number of turns are coupled between the first and second terminal and the second and third terminals. The base of the NPN transistor is coupled to the second terminal of the secondary winding and two diodes are coupled such that their anodes are coupled to the emitter of the NPN transistor and one diode's cathode is coupled to the first terminal of the secondary winding and the other diode's cathode is coupled to the third terminal of the secondary winding. The secondary winding is configured such that the first and third terminals have opposite polarities relative to the common second terminal. In this embodiment, one of the two secondary circuits drives the base-emitter junction and a series diode during each half-cycle of the AC signal. Therefore, the base-emitter is turned on and current is delivered essentially continuously when the AC signal is gated "on". This embodiment is thus termed a full wave circuit configuration. In this embodiment, stand off voltage must have a particular polarity and is thus termed a unipolar switch. As indicated above, a PNP junction transistor may be substituted for the NPN device by reversing the direction of the fast diodes and the voltage source in the load circuit.

Another embodiment of the present invention implements a bipolar high voltage switch using two transformer driven junction transistors in a common base configuration. Two NPN transistors are coupled with their bases and emitters in common and with each collector terminal forming one terminal of a bipolar high voltage switch. The switch is bipolar in that a voltage potential of a load circuit coupled between the two collector terminals may be of either polarity or may switch polarities.

A fast recovery diode is coupled in series with the secondary winding of a transformer. This series circuit is coupled between the common emitter terminal and the common base terminal of the two NPN junction transistors. The primary of the transformer is driven with an AC oscillator signal coupled across the primary in response to a control signal and one of the two NPN transistors, depending on the polarity of the load voltage potential, is turned on by the secondary winding and conducts during the half-cycle its base-emitter junction is forward biased. The return signal from the load voltage source potential is conducted through the base-collector junction of the other NPN transistor. Like the unipolar half-wave circuit described above, the half cycle of the AC oscillator signal when the fast diode is reverse biased relies on stored charge to keep the NPN transistor conducting. As indicated above, two PNP junction transistors may be substituted for the NPN devices by reversing the direction of the fast diode.

Another embodiment of the present invention configures the bipolar high voltage switch such that the series circuit, coupled between the common-emitter terminal and the common base terminal of two NPN transistors, comprises a tapped secondary transformer winding and two fast recovery diodes with common anodes. The common terminal of the tapped secondary winding is coupled to the common-base terminal and each of the other two terminals of the tapped secondary winding is coupled to a cathode of a particular one of the two fast recovery diode. In this manner, the tapped secondary drives the base-emitter junction of the conducting NPN transistor during both halves of the cycle of the AC oscillator signal driving the primary winding of the transformer.

All of the embodiments of the present invention may use low voltage circuitry to drive the primary winding, and, for low current loads, logic gates may be used. By driving the two terminals of the primary winding with separate logic gates outputting complementary square wave signals, the primary winding is driven with an AC oscillator signal where the primary winding current flows in both directions. By assuring good square wave cycle symmetry the primary winding will have little or no direct current component and thus the transformer core will not become magnetized. When the logic gates are dominated by the control signal, both terminals of the primary winding are set to the same logic state and zero voltage is impressed across the primary winding.

In one embodiment of the present invention the primary winding is driven with a simple logic inverter with hysterisis and resistor/capacitor feedback resulting in an oscillator signal with a frequency determined by the values of the resistor and capacitor. A first AND gate may then be used to gate, in response to a DC or lower frequency control signal, the oscillator signal through to one terminal of the primary winding. A second AND gate receives the output of the first AND gate coupled through an inverter and is used to gate, in response to the control signal, the complementary oscillator phase to the other terminal of the primary winding. It is understood that other ways of generating logic level complementary signals to drive the primary of the transformer used to drive high voltage switches, according to embodiments of the present invention, may be employed and are within the scope of the present invention. For example, a combination of a logic gate and two electronic relays may be used to generate the AC signal needed for the primary transformer winding, or a single controlled oscillator may be utilized without exceeding the scope of the invention.

In another embodiment of the present invention, a half wave unipolar high voltage switch is configured using an NPN transistor with the collector and base terminals associated with the positive and negative switch terminals, respectively. Two fast recovery diodes are coupled in series, forming a circuit having the cathode of the first diode and the anode of the second diode exhibiting a common node between the first and second diodes. The series diode circuit is coupled between the base and emitter terminals with the anode of the first diode coupled to the emitter and the cathode of the second diode coupled to the base terminal such that the base emitter junction may be forward biased. A capacitor is coupled from the common node of the first and second diodes to a logic level drive circuit. In this embodiment, the base terminal is coupled to a voltage potential of the voltage source in a load circuit coupled between the positive and negative switch terminals. For example, if NPN transistors are used for the high voltage device, then the base terminal is coupled to the ground voltage potential. The logic level drive circuit charges the capacitor through the second diode coupled to the base terminal during one half of the drive cycle when the output of the logic level drive circuit is a positive logic one level; the base emitter junction is reverse biased. During the second half cycle, the capacitor terminal coupled to the common node of the first and second diodes transitions negative forward biasing the base-emitter junction and delivering the stored charge of the capacitor as a charge limited current. In this embodiment, stored charge in the base region of the NPN junction transistor keeps the NPN transistor conducting during the drive half-cycle when the capacitor is being charged. As described above a PNP junction transistor may be substituted for the NPN device by reversing the direction of the diodes and the polarity direction of the voltage source in the load circuit.

In another embodiment of the present invention, a full wave charge coupled high voltage switch is configured using an NPN transistor with the collector and base terminals operated as the positive and negative switch terminals, respectively. Two parallel circuits each exhibiting two series fast recovery diodes coupled in series forming a circuit having the cathode of a first diode and the anode of a second diode forming a common node between the first and second diodes. Each series circuit is coupled between the base and emitter terminals of a respective NPN junction transistor with the anode of the first diode coupled to the emitter and the cathode of the second diode coupled to the base terminal such that the base emitter junction may be forward biased. Two separate capacitors are used, one coupled from a respective one of the common nodes of the two series diode circuits to separate logic level drive circuits with complementary logic level outputs. In this embodiment, the base terminal is coupled to a voltage potential of the voltage source in the load circuit coupled between the collector and base terminal. If NPN transistors are used for the high voltage device, the base terminal is coupled to the ground voltage potential. The logic level drive circuits charge the capacitors through the second diodes coupled to the base terminal during each half drive cycle when the corresponding outputs of the logic level drive circuits are positive. The NPN junction transistor continues conducting by virtue of charge stored in the base junction. During the second half cycle, the capacitor terminal coupled to the common node of the first and second diodes transitions negative forward biasing the base-emitter junction and delivering the stored charge of the capacitor as a charge limited current.

In this embodiment, one of the complementary outputs delivers charge to the base-emitter junctions during each half cycle of the drive signal thereby enabling full wave operation. As described above a PNP junction transistor may be substituted for the NPN device by reversing the direction of the diodes and the polarity connection of voltage source in the load circuit.

High voltage switches configured according to embodiments of the present invention may be used to make half and full bridge driver circuits for a variety of high voltage loads including cold cathode fluorescent lights. The high voltage switches may also be used in switching regulator circuits in either unipolar, bipolar, half wave and full wave configurations.

The foregoing has outlined broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which:

FIG. 2A is a circuit schematic of another logic level drive for generating and coupling an AC oscillator signal across the primary of a transformer winding;

FIG. 2B is a circuit diagram of a transformer driven NPN junction transistor configured as a full wave unipolar high voltage switch according to embodiments of the present invention;

FIG. 2C is a circuit diagram of a transformer driven pair of NPN junction transistors configured as a full wave bipolar high voltage switch according to embodiments of the present invention;

FIG. 3 is a circuit diagram of a logic level drive circuit and a half wave unipolar high voltage switch driven using capacitive charge coupling according to embodiments of the present invention;

FIG. 4 is a circuit diagram of a logic level drive circuit and a full wave unipolar high voltage switch driven using capacitive charge coupling according to embodiments of the present invention;

DETAILED DESCRIPTION

Figure 1B:
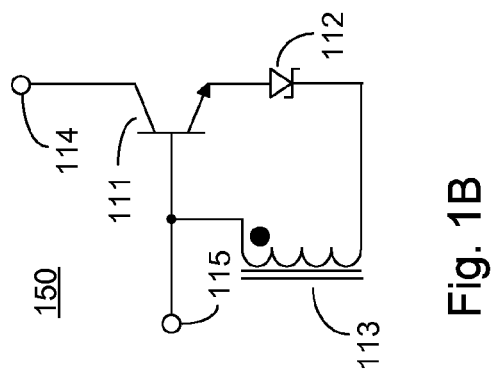
FIG. 1B is a circuit diagram of a transformer driven NPN junction transistor configured as a half wave unipolar high voltage switch according to embodiments of the present invention.

In the following description, specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein like or similar elements are designated by the same reference numeral by the several views.

The high voltage switch configurations in the following detailed description use NPN junction transistors to simplify the explanation. It is understood that a PNP junction transistor may be substituted for the NPN device by reversing the direction of the diodes and the polarity direction of the voltage source in a load circuit coupled to the high voltage switch terminals of a unipolar switch circuit.

Figure 1C:
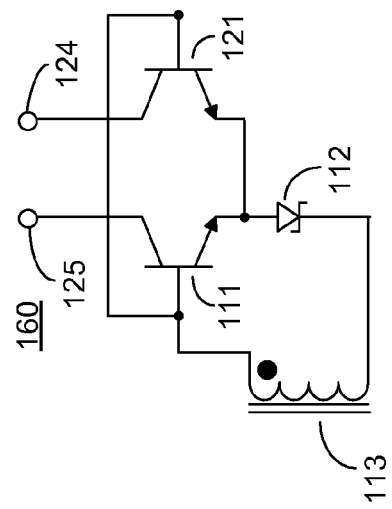
FIG. 1C is a circuit diagram of a transformer driven pair of NPN junction transistors configured as a half wave bipolar high voltage switch according to embodiments of the present invention.
Figure 1A:
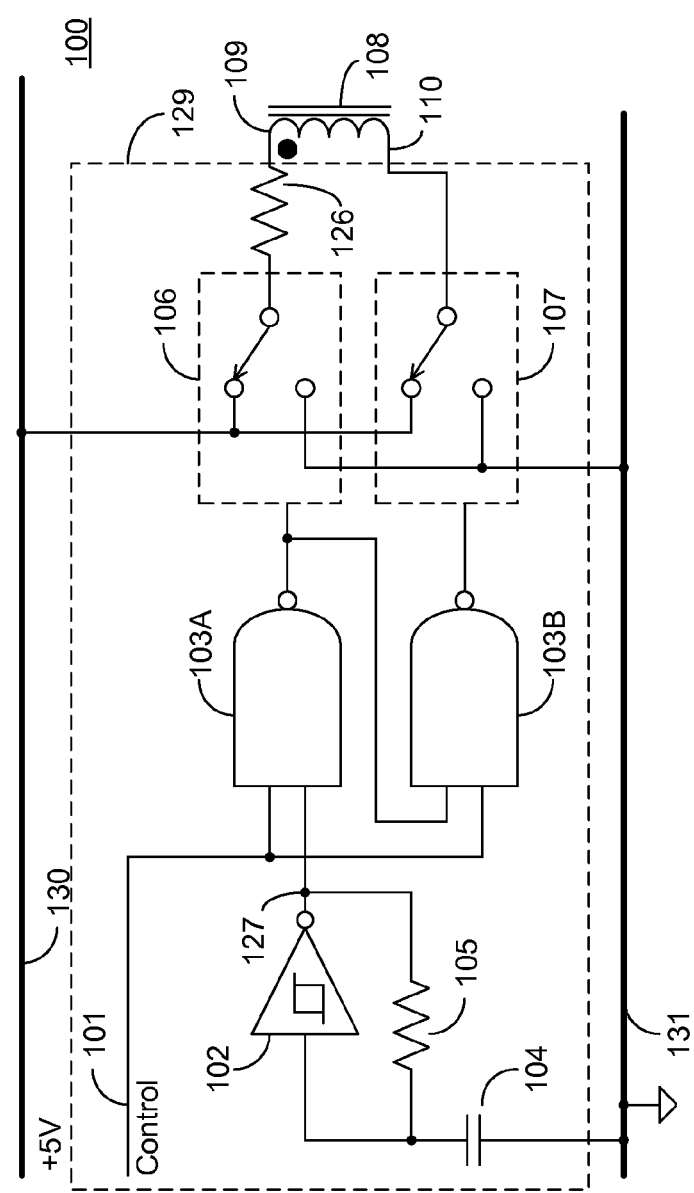
FIG. 1A is a circuit schematic of a logic level drive for generating and coupling an AC oscillator signal across the primary of a transformer winding.

FIG. 1A is an embodiment of an exemplary drive circuit 100 configured to provide a logic level (e.g., 5 volts) alternating current (AC) drive voltage across a primary transformer winding 108 exhibiting transformer terminals 109 and 110. A Schmidt trigger inverter 102 is configured as an oscillator by feeding its output through a resistor 105 to a capacitor 104 coupled to the input of inverter 102. By selecting the appropriate values for resistor 105 and capacitor 104, a square wave oscillator signal of desired frequency is generated. In an exemplary embodiment, a frequency of approximately 2 MHz is selected so that the switches, which will be described further hereinto below in relation to FIGS. 1B, 1C and 3, remain conducting during both halves of the cycle. Inverter 102 thus exhibits an oscillating signal at an output 127. A plurality of NAND gates 103A and 103B are provided. Output 127 is connected to a first input of NAND gate 103A, and the output of NAND gate 103A is connected to a first input of NAND gate 103B. A control signal 101 is connected in parallel to a second input of each of NAND gate 103A and NAND gate 103B. Thus, NAND gates 103A and 103B are enabled when control signal 101 exhibits a logic one and their outputs are complementary of each other with logic states responsive to output 127 of inverter 102.

The outputs of NAND gates 103A and 103B control a pair of electronic relays 106 and 107, respectively, such that terminals 109 and 110 have alternating polarities at the frequency of the output of inverter 102. Electronic relays 106 and 107 are single pole double throw switches each receiving a positive logic supply voltage 130, typically around +5V, and a negative logic supply voltage 131, typically ground. Each of electronic relays 106, 107 is connected as a non-inverting driver. When the output of NAND gate 103A is positive, relay 106 connects the relay arm to positive logic supply voltage 130. Conversely, when the output of NAND gate 103A is at ground, the arm is connected to negative logic supply voltage 131. NAND gate 103B controls relay 107 in the same way.

In operation, when oscillator signal 127 is gated "on" by a logic 1 on control signal 101, the complementary outputs of NAND gates 103A and 103B cause complimentary outputs at the arm terminals of relays 106 and 107, providing square wave AC drive with enhanced current capability to transformer primary winding 108. A resistor 126 arranged between the relay arm of relay 106 and terminal 109 limits the drive current. When control signal 101 is a logic 0, NAND gates 103A, 103B are dominated by the control signal, both gate outputs are high, and +5V is applied to both ends of transformer primary winding 108. This is a null drive to the transformer and produces no AC at a secondary. Drive circuit 100 is thus a controllable square wave generator with a complementary buffered output.

FIG. 1B is a common base unipolar high voltage switch 150 according to embodiments of the present invention. A secondary winding 113 is magnetically coupled to transformer primary winding 108 discussed relative to FIG. 1A. An NPN junction transistor 111 is the active switch device with its collector terminal coupled as a positive switch terminal 114, and its base terminal coupled as a negative switch terminal 115. A load circuit (not shown), having a high voltage source, well in excess of positive logic supply 130, is coupled between positive switch terminal 114 and negative switch terminal 115, with the positive potential of the high voltage load source directed to positive terminal 114. Current will flow into positive switch terminal 114 and return to negative switch terminal 115 when NPN junction transistor 111 is turned on and conducting. A fast recovery diode 112 and secondary transformer winding 113 are connected in series and coupled between the emitter and the base terminals of NPN junction transistor 111, with the anode of fast recovery diode 112 facing the emitter terminal. When the polarity of secondary transformer winding 113 is driven positive at the base terminal corresponding with negative switch terminal 115 with respect to the cathode of fast recovery diode 112, the base-emitter junction of NPN junction transistor 111 is forward biased turning on NPN junction transistor 111. Current from the load circuit flows as collector current into positive switch terminal 114. Base current from secondary transformer winding 113 is driven into the base terminal of NPN junction transistor 111 and the combination of the base current and the collector current forms the emitter current flowing in the emitter circuit. The emitter current flows through secondary transformer winding 113 and the collector current returns to the load circuit (not shown) coupled between positive switch terminal 114 and negative switch terminal 115. When the voltage across secondary transformer winding 113 reverses polarity on the second half of the cycle of the AC oscillator signal, secondary transformer winding 113 applies a voltage polarity to back-bias fast recovery diode 112; base current and thus base charge are no longer being supplied to NPN junction transistor 111. NPN junction transistor 111 will turn off as soon as the charge stored in the base region during the driving cycle has recombined with charges from the collector. If sufficient charge has been supplied to the base region during the active charge cycle, and correspondingly the second half of the cycle of the AC oscillator signal is of a sufficiently short duration, then NPN junction transistor 111 will remain on and load current will continue to flow. If control signal 101 is a logic zero, NAND gates 103A and 103B are de-gated and no drive is supplied to electronic relays 106 and 107. In this state, electronic relays 106 and 107 are configured to supply a zero DC voltage differential across transformer terminals 109 and 110. Thus there will be no transformer action; the voltage across secondary transformer winding 113 will collapse and the base emitter circuit of NPN junction transistor 111 is effectively open circuited. After any stored charge is removed from the base region of NPN junction transistor 111, NPN junction transistor 111 turns off with a hold off voltage up to the voltage breakdown of the collector-to-base junction with the emitter open circuited, denoted Vcbo.

Since current and thus charge are driven into NPN junction transistor 111 only one-half of the cycle of the AC signal driving primary transformer winding 108 of FIG. 1A, high voltage switch 150 is termed a half-wave switch. NPN junction transistor 111 can only stand off voltage of one polarity when gated "off" and thus high voltage switch 150 is a unipolar half-wave switch.

FIG. 1C is a common base bipolar high voltage switch 160 according to another embodiment of the present invention. Switch 160 is shown driven by secondary transformer winding 113 which is magnetically coupled to primary transformer winding 108 of FIG. 1A. In this embodiment, a second NPN junction transistor 121 is coupled in parallel with NPN junction transistor 111 described above in relation to FIG. 1B such that their emitter terminals and their base terminals are coupled in common. In this configuration, the collector of NPN junction transistor 111 is associated with a first switch terminal 125 and the collector of second NPN junction transistor 121 is associated with a second switch terminal 124 of high voltage switch 160. All other elements of switch 160 are as described above in relation to switch 150 of FIG. 1B.

When the polarity of the AC oscillator signal from drive circuit 100 of FIG. 1A drives a positive potential on the common base terminal with respect to the cathode of diode 112, both base to emitter junctions of transistors 111 and 121 are turned on and charged with current from secondary transformer winding 113. However, depending on the polarity of the voltage source (not shown) in a load circuit coupled across switch terminals 124 and 125, only one of NPN junction transistor 111 and second NPN junction transistor 121 will conduct. If switch terminal 125 is positive with respect to switch terminal 124, then NPN junction transistor 111 will conduct as a transistor when the base to emitter junctions are forward biased. In this condition, current from the load circuit flows into terminal 125, through NPN junction transistor 111, fast diode 112, secondary transformer winding 113, and returns through the base-collector junction of transistor 121 to switch terminal 124. If the polarity of the voltage source in the load circuit coupled across switch terminals 124 and 125 is reversed such that switch terminal 124 is positive with respect to switch terminal 125, then current flow is likewise reversed. Current will then flow into switch terminal 124 through second NPN junction transistor 121, fast diode 112, secondary transformer winding 113, and return through the base-collector junction of NPN junction transistor 111 to switch terminal 125. Switch 160 is thus bipolar and when gated off by control signal 101, the load circuit may be of either polarity. When gated on, current through the switch terminals will flow in either direction during the time that NPN junction transistors 111, 121, respectively, are driven on or during the time their corresponding stored base charge is sufficient to keep them conductive. Since NPN junction transistors 111 and 121 are driven into conduction on only one-half of the cycle of the AC oscillator signal, switch 160 is termed a half-wave, bipolar, high voltage switch. The voltage source of a load circuit coupled across switch terminals 124 and 125 may be one of DC or AC.

FIG. 2A is an embodiment of a drive circuit 200 configured to provide a logic level (e.g., 5 volts) alternating current (AC) drive voltage across a primary transformer winding 208 exhibiting transformer terminals 209 and 210. A Schmidt trigger inverter 102 is configured as a square wave oscillator by feeding its output through a resistor 105 to a capacitor 104 coupled to its input. The frequency of the oscillator is set by selecting appropriate values for resistor 105 and capacitor 104. In an exemplary embodiment, a frequency of approximately 2 MHz is selected so that the switches, which will be described further hereinto below, remain conducting during both halves of the cycle. Inverter 102 thus exhibits a square wave oscillating signal at an output 127.

An AND gates 203 and an AND gate 207 are provided. Output 127 is connected to a first input of AND gate 203, and the output of AND gate 203 is connected to an input of an inverter 206. The output of inverter 206 is connected to a first input of AND gate 207 and in parallel to a first terminal 209 of a primary transformer winding 208. The output of AND gate 207 is connected to the input of an inverter 205 and the output of inverter 205 is connected via a resistor 226 to a second terminal 210 of primary transformer winding 208. A control signal 101 is connected in parallel to a second input of each of AND gate 203 and AND gate 207. Thus, AND gates 203 and 207 are enabled when control signal 101 exhibits a logic one and the outputs of inverters 205, 206 are complementary of each other with logic states responsive to output 127 of inverter 102. It is understood that AND gate 203 and inverter 206 and AND gate 207 and inverter 205 may be combined as NAND gates.

In operation, when oscillator signal 127 is gated "on" by a logic 1 on control signal 101, then the complimentary outputs of inverters 206, 207 apply complementary signal voltages across primary transformer winding 208 thereby providing square wave AC drive with enhanced current capability to transformer primary winding 208. A resistor 126 arranged between the output of inverter 205 and second terminal 210 limits the drive current. When control signal 101 is a logic 0, AND gates 203, 207 are dominated by the control signal, both gate outputs are low, and +5V is applied to both ends of transformer primary winding 208. This is a null drive to the transformer and produces no AC at a secondary. By controlling the asymmetry of the square wave oscillator signal 127, little or no DC current flows in transformer primary winding 208 thus eliminating magnetizing of the core of the transformer. Resistor 226 sets the available drive current. Drive circuit 200 is thus a controllable square wave generator with a complementary buffered output.

FIG. 2B is a common base bipolar high voltage switch 250 according to embodiments of the present invention. A secondary transformer winding 213 and a secondary transformer winding 214 have equal turns and a common terminal and are magnetically coupled to primary transformer winding 208 of FIG. 2A. An NPN junction transistor 211 is the active switch device with its collector terminal associated with a positive switch terminal 216 and its base terminal associated with a negative switch terminal 215. A load circuit (not shown), having a high voltage source, is coupled between positive switch terminal 216 and negative switch terminal 215. Current will flow into positive switch terminal 216 and return to negative switch terminal 215 when NPN junction transistor 211 is turned on and conducting. A fast recovery diode 212 and secondary transformer winding 213 are connected in series with the anode of fast recovery diode 212 facing the emitter terminal of NPN junction transistor 211. A fast recovery diode 217 and secondary transformer winding 214 are connected in series with the anode of fast recovery diode 217 facing the emitter terminal of NPN junction transistor 211. The common terminal of transformer secondary windings 213, 214 are coupled to the base terminal of NPN junction transistor 211, associated with negative switch terminal 215. When the polarity of secondary transformer winding 213 is driven positive at the base terminal with respect to the cathode of fast recovery diode 212, the base-emitter junction is forward biased turning NPN junction transistor 211 on. Likewise, when the polarity of secondary transformer winding 214 is driven positive at the base terminal with respect to the cathode of fast recovery diode 217, the base-emitter junction of NPN junction transistor 211 is forward biased turning NPN transistor 211 on. Thus the AC oscillator signal driving the primary winding drives current and thus charge into the base to emitter junction of transistor 211 on both halves of the AC signal. In this configuration, transistor 211 does not rely on stored charge to keep conducting during one half cycle of the AC signal.

Current from the load circuit flows as collector current into positive switch terminal 216. Base current from respective secondary transformer winding 213, 214, on both halves of the cycle of the primary AC oscillator signal, is driven into the base terminal of NPN junction transistor 211 and the combination of base current and collector current forms emitter current flowing in the emitter circuit. The emitter current flows through secondary transformer winding 213, 214, respectively, and the collector current returns to the load circuit coupled between positive switch terminal 216 and negative switch terminal 215. When the voltage across a first one of secondary transformer windings 213, 214 reverses polarity on the second half of the cycle of the AC oscillator signal, a second one of secondary transformer windings 213, 214 applies a voltage polarity to turn on NPN junction transistor 211; base current and thus base charge is again supplied to NPN junction transistor 211. If control signal 101 of FIG. 2A is a logic zero, AND gate 203 and AND gate 207 are de-gated and both terminals 209 and 210 are driven to a logic one voltage level. The voltage across secondary transformer windings 213, 214 collapses and the base emitter circuit of NPN junction transistor 211 is effectively open circuited. After any stored charge is removed from the base region of NPN junction transistor 211, NPN junction transistor 211 turns off and the potential of the voltage source in the load circuit is held off by the breakdown potential of the collector to base junction with the emitter open circuited, denoted Vcbo. Since charge is supplied to NPN junction transistor 211 by an AC coupled transformer winding, the high voltage full wave switch formed by this configuration is "charge limited" and charge is supplied each half cycle of the AC square wave oscillator signal driving primary transformer winding 208, and is limited by the resistor 226. Switch 250 is thus termed a full wave, unipolar high voltage switch.

FIG. 2C is a common base bipolar high voltage switch 260 according to another embodiment of the present invention. Switch 260 shown driven by a plurality of secondary transformer windings 213 and 214 magnetically coupled to primary transformer winding 208 shown in FIG. 2A driven by the AC signal of driver circuit 200. In this embodiment, a second NPN junction transistor 221 is coupled in parallel with NPN junction transistor 211 of FIG. 2B such that their emitter terminals and their base terminals are coupled in common. In this configuration, the collector of NPN junction transistor 211 is associated with a first switch terminal 225 and the collector of second NPN junction transistor 221 is associated with a second switch terminal 224 of high voltage switch 260. All other elements of switch 260 are as described above in relation to switch 250 of FIG. 2B.

When the polarity of the AC oscillator signal from driver 200 drives a positive potential on the common base terminal with respect to the cathode of fast recovery diode 212, both base to emitter junctions of NPN junction transistors 211 and 221 are forward biased by secondary transformer winding 213. However, depending on the polarity of the voltage source (not shown) in a load circuit coupled between switch terminals 224 and 225, only one of NPN junction transistors 211 and 221 will conduct as a transistor. If switch terminal 225 is positive with respect to switch terminal 224, then NPN junction transistor 211 will conduct when the base to emitter junctions are forward biased. In this condition, current from a load circuit flows into terminal 225, through NPN junction transistor 211, fast recovery diode 212, secondary transformer winding 213, and returns through the collector-base junction of second NPN junction transistor 221 to switch terminal 224. If the polarity of the voltage source in the load circuit coupled across switch terminals 224 and 225 is reversed such that switch terminal 224 is positive with respect to switch terminal 225, then current flow is likewise reversed. Current will then flow into switch terminal 224 through second NPN junction transistor 221, fast recovery diode 212, secondary transformer winding 213, and return through the collector-base junction of NPN junction transistor 211 to switch terminal 225.

Switch 260 is bipolar in that, when gated off, stand off voltage may be of either polarity. When gated on, current through switch terminals 224 and 225 may flow in either direction, depending of the polarity of the load voltage source, during the time that NPN junction transistors 211, 221, respectively, are driven on or during the time their corresponding stored base charge is sufficient to keep them conductive. When the AC oscillator signal driving primary transformer winding 208 reverses polarity, secondary transformer winding 214 applies a positive potential to the common base terminal of NPN junction transistors 211, 221. In this manner, the base-emitter junctions of NPN junction transistors 211 and 221 are again forward biased during the second half cycle of the AC signal driving primary transformer winding 208. Switch 260 operates in the full wave mode wherein the switch NPN junction transistors 211, 221 are driven during both half cycles of the primary AC oscillator signal when gated "on" by control input 101. Since NPN junction transistors 211, 221 are driven into conduction on each half of the cycles of the AC signal driving primary transformer winding 208, switch 260 is a full wave, bipolar, high voltage switch. The voltage source of a load circuit coupled across switch terminals 224 and 225 may be DC of either polarity, or may be AC.

FIG. 3 is a circuit diagram of a common base unipolar high voltage switch 350 according to embodiments of the present invention and a driver circuit 300 suitable for driving high voltage switch 350. High voltage switch 350 comprises an NPN junction transistor 111 as the active switch device with its collector terminal associated with, and coupled as, a positive switch terminal 114 and its base terminal associated with, and coupled as, a negative switch terminal 115. A load circuit (not shown), having a high voltage source, is coupled between positive switch terminal 114 and negative switch terminal 115. Current will flow into positive switch terminal 114 and return to negative switch terminal 115 when NPN junction transistor 111 is turned on and conducting. For this operation, the positive voltage potential of the load voltage source (not shown) is directed to positive switch terminal 114. A pair of fast recovery diodes 112, 313 are connected in series and coupled between the emitter and the base terminals of NPN junction transistor 111, with the anode of fast recovery diode 112 coupled to the emitter terminal of NPN junction transistor 111 and the cathode of fast recovery diode 313 coupled to the base terminal of NPN junction transistor 111. A first end of a capacitor 302 is coupled to a common terminal defined between the cathode of fast recovery diode 112 and the anode of fast recovery diode 313, denoted terminal 303. The second end of capacitor 302 is coupled to an output 301 of driver 300 via a resistor 352. In this configuration negative switch terminal 115 and thus the base terminal of NPN junction transistor 111 have a low impedance path 351 to the ground of drive circuit 300.

Drive circuit 300 is configured to provide a logic level (e.g., 5 volts) drive voltage to capacitor 302. A Schmidt trigger inverter 102 is configured as an oscillator by feeding its output through a resistor 105 to a capacitor 104 coupled to its input. The frequency of the oscillator is set by selecting appropriate values for resistor 105 and capacitor 104, and the oscillator output thus appears at output 127 of inverter 102. In an exemplary embodiment, a frequency of approximately 2 MHz is selected so that switch 350 remains conducting during both halves of the cycle. Output 127 is fed to a first input of an AND gate 203, and a second input of AND gate 203 is connected to a control signal 101. AND gate 203 is thus gated "on" and "off" by control signal 101, a quasi DC control. The output of AND gate 203 is coupled to an inverter 206 to increase available current, and the output of inverter 206 represents output 301 of driver 300. Resistor 352 limits the current through capacitor 302 at the steep rising and falling edges of the drive waveform. While resistor 352 it is shown as a separate element, in one embodiment resistor 352 is constituted of the internal output resistance of inverter 206. Drive circuit 300 is thus a controllable square wave generator with a buffered output.

During the positive half cycle of the drive appearing at output 301, terminal 303 is driven to a voltage equal to the voltage appearing at positive switch terminal 115, equivalent to the base of NPN junction transistor 111, plus the forward voltage drop across fast recovery diode 313. During the negative half cycle of the drive waveform appearing at output 301, the voltage at the input side of capacitor 302 changes by −5V. During this same negative half cycle, the voltage at terminal 303 on the output side of capacitor 302 changes from the voltage appearing at terminal 115 plus the forward diode voltage drop to the voltage at terminal 115 minus a base-emitter forward drop, minus the forward voltage drop across fast recovery diode 112. Thus a change in voltage of −5V on one side of capacitor 302 results in a voltage change on the other side of capacitor 302 of approximately −1.9V. The change in charge necessary to reconcile this discrepancy is driven into the emitter terminal of NPN junction transistor 111, and is available to the load (not shown) at the collector terminal. This action recurs once per cycle of the oscillator, and the charge times the frequency is the available current. Available current can be controlled by sizing the capacitance of 302 and/or by setting the frequency of the oscillator. The drive current supplied through capacitor 302 flows in a closed path. The return side of this path is through low AC impedance block 351. Current from a load circuit (not shown) coupled between switch terminals 114 and 115 flows into positive switch terminal 114, on the positive half of the drive cycle, through the collector and emitter of NPN junction transistor 111, through fast recovery diode 112, and through fast recovery diode 313 to the switch negative terminal 115. NPN junction transistor 111 and thus high voltage switch 350 will remain on until the stored charge, not used by the load during the negative portion of the drive cycle, is depleted.

Upon reflection, it can be understood that the current in the load, exclusive of collector-base leakage, is limited by the charge change on capacitor 302 in each drive cycle. Thus the switch is referred to as a charge-limited driven-emitter switch. The emitter current occurs only during half of the drive cycle, so this embodiment is further described as half-wave, even though collector current may be continuous due to recovery of charge stored in the base-emitter junction of NPN junction transistor 111.

FIG. 4 is a circuit diagram of another common base junction transistor high voltage switch 450 and a driver circuit 400 suitable for driving high voltage switch 450 according to embodiments of the present invention. High voltage switch 450 comprises an NPN junction transistor 111 as the active switch device, with its collector terminal associated with a positive switch terminal 114 and its base terminal associated with a negative switch terminal 115. In application, a load circuit (not shown), having a high voltage source, is coupled between positive switch terminal 114 and negative switch terminal 115. Current will flow into positive switch terminal 114 and return to negative switch terminal 115 when NPN junction transistor 111 is turned on and conducting. For this operation, the positive voltage potential of the load voltage source (not shown) is directed to positive switch terminal 114. A pair of fast recovery diodes 112, 313 are connected in series and coupled between the emitter and the base terminals of NPN junction transistor 111, with the anode of fast recovery diode 112 coupled to the emitter terminal of NPN junction transistor 111 and the cathode of fast recovery diode 313 coupled to the base terminal of NPN junction transistor 111. Likewise another pair of fast recovery diodes 412, 413 are series connected and coupled between the emitter and base terminals of NPN junction transistor 111, with the anode of fast recovery diode 412 coupled to the emitter terminal of NPN junction transistor 111 and the cathode of fast recovery diode 413 coupled to the base terminal of NPN junction transistor 111. A first end of a capacitor 302 is coupled to the common terminal between fast recovery diodes 112 and 313, denoted terminal 303, and a second end of capacitor 302 is coupled to an output 301 of driver 400 by way of a resistor 426. A first end of a capacitor 402 is coupled to the common terminal between fast recovery diodes 412 and 413, denoted terminal 403, and a second end of capacitor 403 is connected to an output 401 of driver 400 by way of a resistor 427.

Drive circuit 400 is configured to provide two logic level (e.g., 5 volts) complementary drive signals at outputs 301 and 401 to capacitors 302 and 402, respectively. A Schmidt trigger inverter 102 is configured as an oscillator by feeding its output through a resistor 105 to a capacitor 104 coupled its input. The frequency of the oscillator is set by selecting appropriate values for resistor 105 and capacitor 104, and the oscillator output thus appears at output 127 of inverter 102. In an exemplary embodiment, a frequency of approximately 2 MHz is selected so that switch 450 remains conducting during both halves of the cycle. Output 127 is fed to a first input of an AND gate 203, and a second input of AND gate 203 is connected to a control signal 101. AND gate 203 is thus gated "on" and "off" by control signal 101, a quasi DC control. The output of AND gate 203 is coupled to an inverter 206 to increase available current, and the output of inverter 206 represents output 301 of driver 400. Resistor 426 limits the current through capacitor 302 at the steep rising and falling edges of the drive waveform. While resistor 426 it is shown as a separate element, in one embodiment resistor 426 is constituted of the internal output resistance of inverter 206. Output 127 is further fed to a first input of an AND gate 207, and a second input of AND gate 207 is connected to control signal 101. AND gate 207 is thus similarly gated "on" and "off" by control signal 101, a quasi DC control. The output of AND gate 207 is coupled to an inverter 205 to increase available current, and the output of inverter 206 represents output 401 of driver 400. Resistor 427 limits the current through capacitor 402 at the steep rising and falling edges of the drive waveform. While resistor 427 it is shown as a separate element, in one embodiment resistor 427 is constituted of the internal output resistance of inverter 205. Drive circuit 400 is thus a controllable square wave generator with a buffered complementary output.

During the positive half-cycle of the drive waveform appearing at output 301, terminal 303 is driven to a voltage equal to the voltage on negative switch terminal 115, equivalent to the base terminal of NPN junction transistor 111, plus the forward drop across diode 313. During the negative half of the drive waveform 301, the voltage at the input side of capacitor 302 changes by −5V. During this same negative half cycle, the voltage at terminal 303 on the output side of capacitor 302 changes from the voltage appearing at terminal 115 plus the forward diode voltage drop to the voltage at terminal 115 minus a base-emitter forward drop, minus the forward voltage drop across fast recovery diode 112. Thus a change in voltage of −5V on one side of capacitor 302 results in a voltage change on the other side of capacitor 302 of approximately −1.9V. The change in charge necessary to reconcile this discrepancy is driven into the emitter terminal of NPN junction transistor 111, and is available to the load (not shown) at the collector terminal. This action recurs once per cycle of the oscillator.

During the positive half cycle of the drive waveform appearing at output 401, terminal 403 is driven to a voltage equal to the voltage on negative switch terminal 115, equivalent to the base NPN junction transistor 111, plus the forward drop across diode 413. During the negative half of the drive waveform 401, the voltage at the input side of capacitor 402 changes by −5V. During this same negative half cycle, the voltage at terminal 403 on the output side of capacitor 402 changes from the voltage on negative switch terminal 115 plus a forward diode voltage drop to the voltage at terminal 115 minus a base-emitter forward drop, minus the forward voltage drop across fast recovery diode 412. Thus a change in voltage of −5V on one side of capacitor 402 results in a voltage change on the other side of capacitor 402 of approximately −1.9V. The change in charge necessary to reconcile this discrepancy is driven into the emitter terminal of NPN junction transistor 111, and is available to the load (not shown) at the collector terminal. This action recurs once per cycle of the oscillator.

Since the drive voltages at outputs 301 and 401 are complimentary, charge is driven into the emitter during both halves of the oscillator cycle and the drive is termed full wave. Further, if capacitors 302 and 402 are chosen to have identical capacitances, currents through the capacitors are complimentary and each is the return current for the other. Thus, no low impedance return path is shown, and while not transformer isolated like other embodiments described herein, the load circuit floats from the drive circuit. Since charge is supplied to high voltage switch 450 on both half cycles of the oscillator signal, switch 450 operates as a full wave, unipolar driven-emitter high voltage switch.

A logic zero at signal 101 de-gates AND gates 203 and 207 and outputs 301, 401 both transition to a logic one, reverse biasing diodes 112 and 412 and thereby opening the emitter circuit of NPN junction transistor 111. After any stored charge is removed from the base region of NPN junction transistor 111, NPN junction transistor 111 turns off and the potential of the voltage source in the load circuit is held off by the breakdown potential of the collector-base junction with the emitter open circuited, denoted Vcbo.

Figure 5:
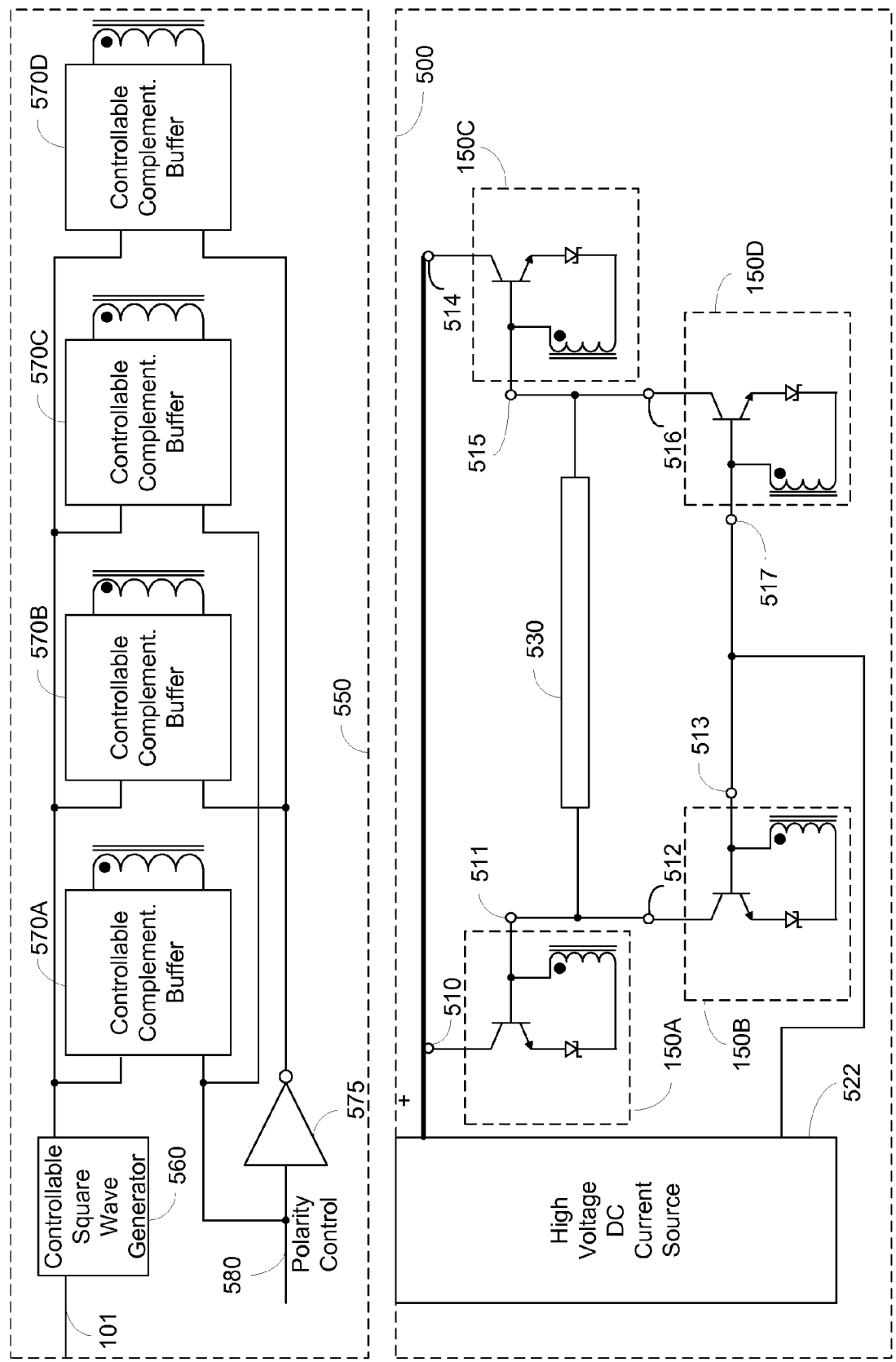
FIG. 5 is a circuit diagram of an H bridge circuit with driver circuitry for driving a square wave current through a CCFL load using half wave, unipolar, high voltage switches according to embodiments of the present invention.

FIG. 5 is a full H-bridge circuit 500 utilizing high voltage switches 150 according to embodiments of the present invention to drive an exemplary cold cathode fluorescent lamp (CCFL) 530 as a load. The four high voltage switches are labeled 150A-150D and operate in all respects as described above in relation to FIG. 1B, with positive switch terminals being denoted respectively terminals 510, 512, 514 and 516 and negative switch terminals being denoted respectively terminals 511, 513, 515 and 517.

To form one leg of H bridge circuit 500, positive terminal 510 of switch 150A is coupled to the positive side of a high voltage DC current source 522 and negative terminal 511 of switch 150A is coupled to a first terminal of CCFL 530. To form another leg of the H bridge circuit 500, positive terminal 516 of switch 150D is coupled to a second terminal of CCFL 530 and negative terminal 517 of switch 150D is coupled to the negative side of high voltage DC current source 522. Switches 150A and 150D enable current flow in one direction through CCFL 530.

To form a third leg of H bridge circuit 500, positive terminal 514 of switch 150C is coupled to the positive side of high voltage DC current source 522 and negative terminal 515 of switch 150C is coupled to the second terminal of CCFL 530. To form the last leg of the H bridge circuit 500, positive terminal 512 of switch 150B is coupled to the first terminal of CCFL 530 and negative terminal 513 of switch 150B is coupled to the negative side of high voltage DC current source 522. Switches 150C and 150B enable current flow in the opposite direction through CCFL 530. In this manner, H bridge circuit 500 enables bi-directional current flow through CCFL 530.

Driver circuitry 550 is suitable to drive H bridge switch circuitry 500 and comprises: a controllable square wave generator 560; a plurality of controllable complementary buffers 570A, 570B, 570C and 570D; an inverter 575; a control signal 101; and a polarity control signal 580. Polarity control signal 580 is connected to the input of inverter 575 and to the gate inputs of controllable complementary buffers 570A and 570C. The output of inverter 575 is connected to the gate inputs of controllable complementary buffers 570B and 570D. The primary transformer windings of each of controllable complementary buffers 570A, 570B, 570C and 570D are magnetically coupled to the respective secondary transformer winding of switches 150A, 150B, 150C and 150D. The output of controllable square wave generator 560 is fed to the input of each of controllable complementary buffers 570A, 570B, 570C and 570D. The frequency of controllable square wave generator 560 is preferably selected, as described above, so that switches 150A, 150B, 150C and 150D conduct through both halves of the cycle. Control signal 101 is connected to the gate input of controllable square wave generator 560 to enable, or disable operation.

Polarity control signal 580 enables bi-directional drive to CCFL 530. In particular, when polarity control signal 580 represents a logic high, controllable complementary control buffers 570A and 570C exhibit a square wave at the output, responsive to the output of controllable square wave generator 560, and power flows through CCFL 530 via switches 150A, 150C. When polarity control signal 580 represents a logic low, controllable complementary control buffers 570B and 570D exhibit a square wave at the output, responsive to the output of controllable square wave generator 560, and power flows through CCFL 530 via switches 150B, 150D. Polarity control signal 580 may represent a square wave input thereby continuously lighting CCFL 530 with a drive of changing polarity.

Figure 6:
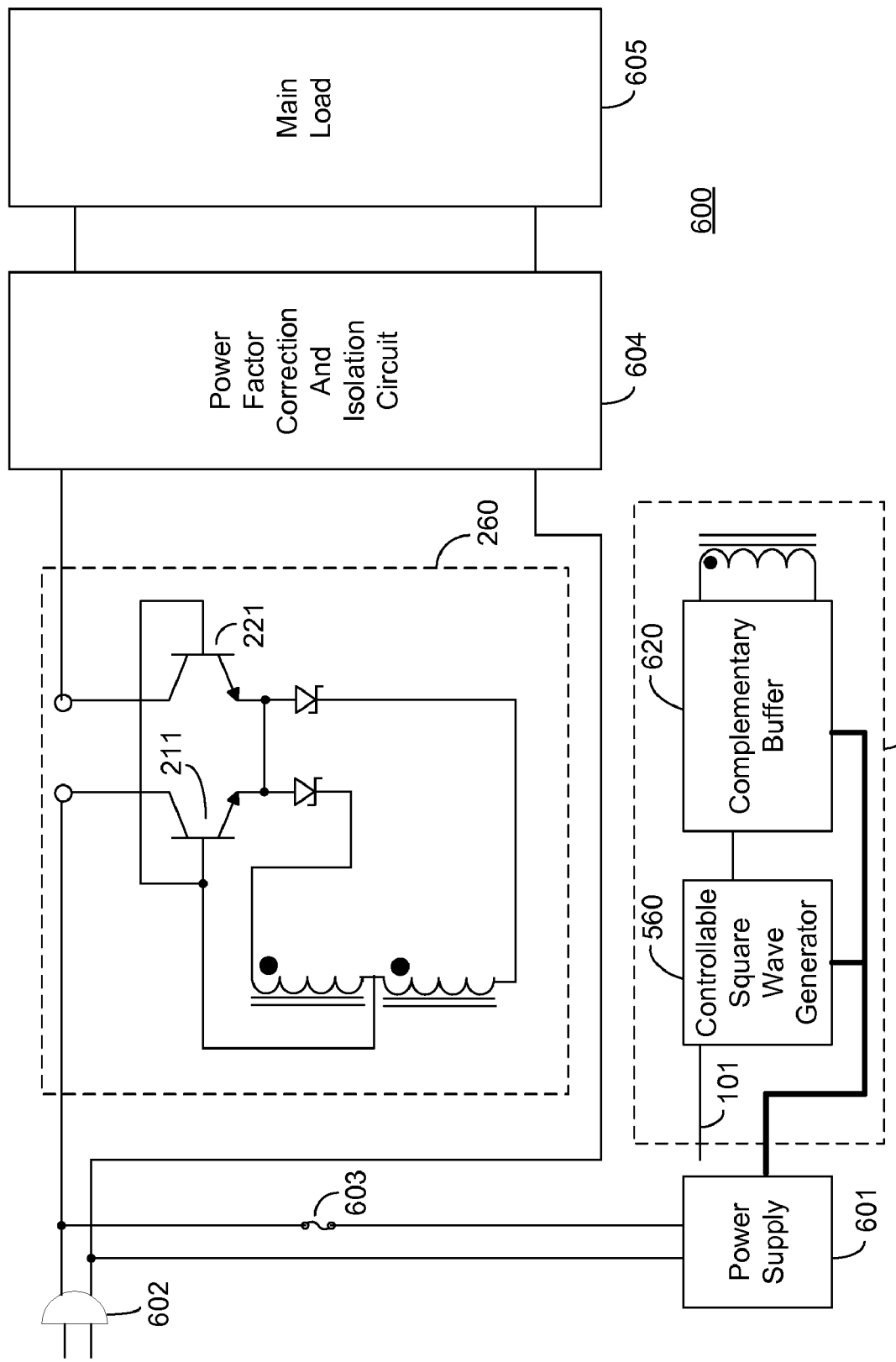
FIG. 6 is a circuit block diagram of a full wave, bipolar, high voltage switch used in conjunction with an off-line switching regulator according to embodiments of the present invention.

FIG. 6 is a circuit block diagram of a bipolar switch 260 used in an off-line switching regulator 600 in accordance with a principle of the invention. Bipolar switch 260 comprised a pair of NPN junction transistors 211, 221. The detail operation of high voltage bipolar switch 260 has been described in detail relative to FIG. 2C. AC line voltage 602 is coupled through a fuse 603 to a "keep alive" power supply 601 and via high voltage bipolar switch 260 to a power factor correction circuitry 604. Bipolar switch 260 is driven by a driver 610, depicted herein as a controllable square wave generator 560, receiving a control signal 101 as an input and feeding a complementary buffer 620. Driver 610 is powered by keep alive power supply 601. In one non-limiting embodiment driver 610 is implemented as driver 200 of FIG. 2A.

In operation, control signal 101 gates bipolar switch 260 "on" and "off". When bipolar switch 260 is on, AC current flows through NPN junction transistors 211 and 221 as described above in relation to FIGS. 2A and 2C. When control signal 101 is a logic zero, switch 260 holds off AC line 602 with the Vcbo of either NPN junction transistor 211 or NPN junction transistor 221 depending on the polarity of AC line 602. Power factor correction circuit 604 is coupled to a main load 605.

Figure 7A:
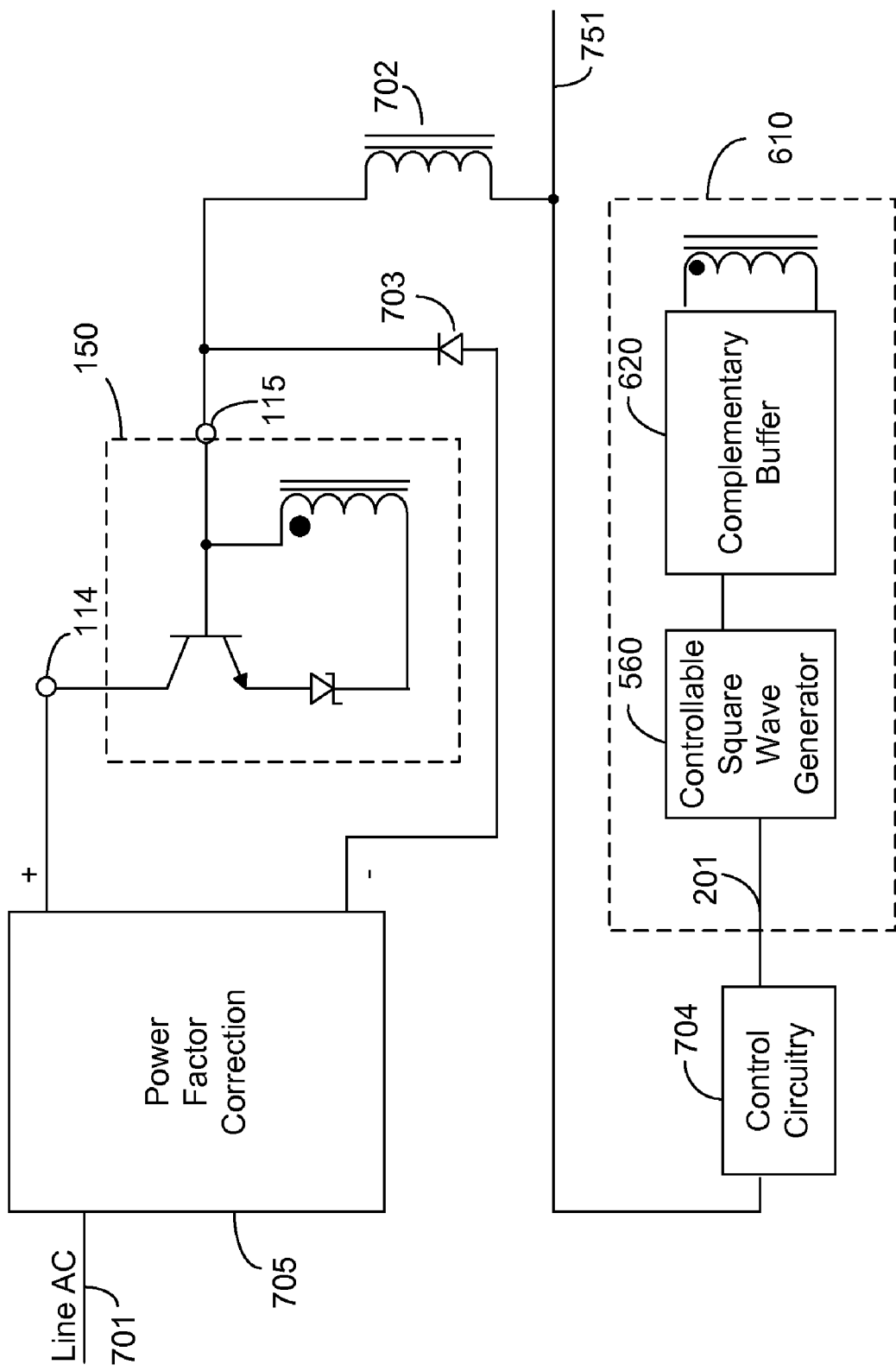
FIG. 7A is a circuit block diagram of a half wave, unipolar, transformer driven high voltage switch used in a buck switching regulator according to embodiments of the present invention.

FIG. 7A is a circuit block diagram of a buck regulator circuit in accordance with a principle of the invention. A high voltage switch 150 is driven by a controllable alternating current signal source, namely driver 610, depicted herein as a controllable square wave generator 560, receiving a control signal 201 as an input and feeding a complementary buffer 620. In one non-limiting embodiment driver 610 is implemented as driver 200 of FIG. 2A. The operation of switch 150 has been explained in detail relative to FIG. 2A.

An AC line voltage 701 is coupled to a power factor correction circuit 705. The positive high voltage potential of power factor correction circuit 705 is coupled to a positive switch terminal 114 of high voltage switch 150 and a negative switch terminal 115 of high voltage switch 150 is coupled to a first end of an inductor 702 supplying a load (not shown) shown as node 751. For simplicity the return is not shown. The voltage at node 751 is sensed by a control circuit 704 to determine when to turn on and off high voltage switch 150. When control circuit 704 determines to turn on high voltage switch 150, it sets output signal 201 active, thereby enabling driver 610, and in response current from power factor corrector 705 is conducted through switch 150 to charge inductor 702. When controller 704 determines the output is at a desired level, the controller causes control signal 201 to go low. Switch 150 is thereby turned off and the current in inductor 702 turns on a fly back diode 703 connected between the return of power factor correction circuit 705 and negative switch terminal 115 to continue current flowing to the load until switch 150 is turned back on.

Figure 7B:
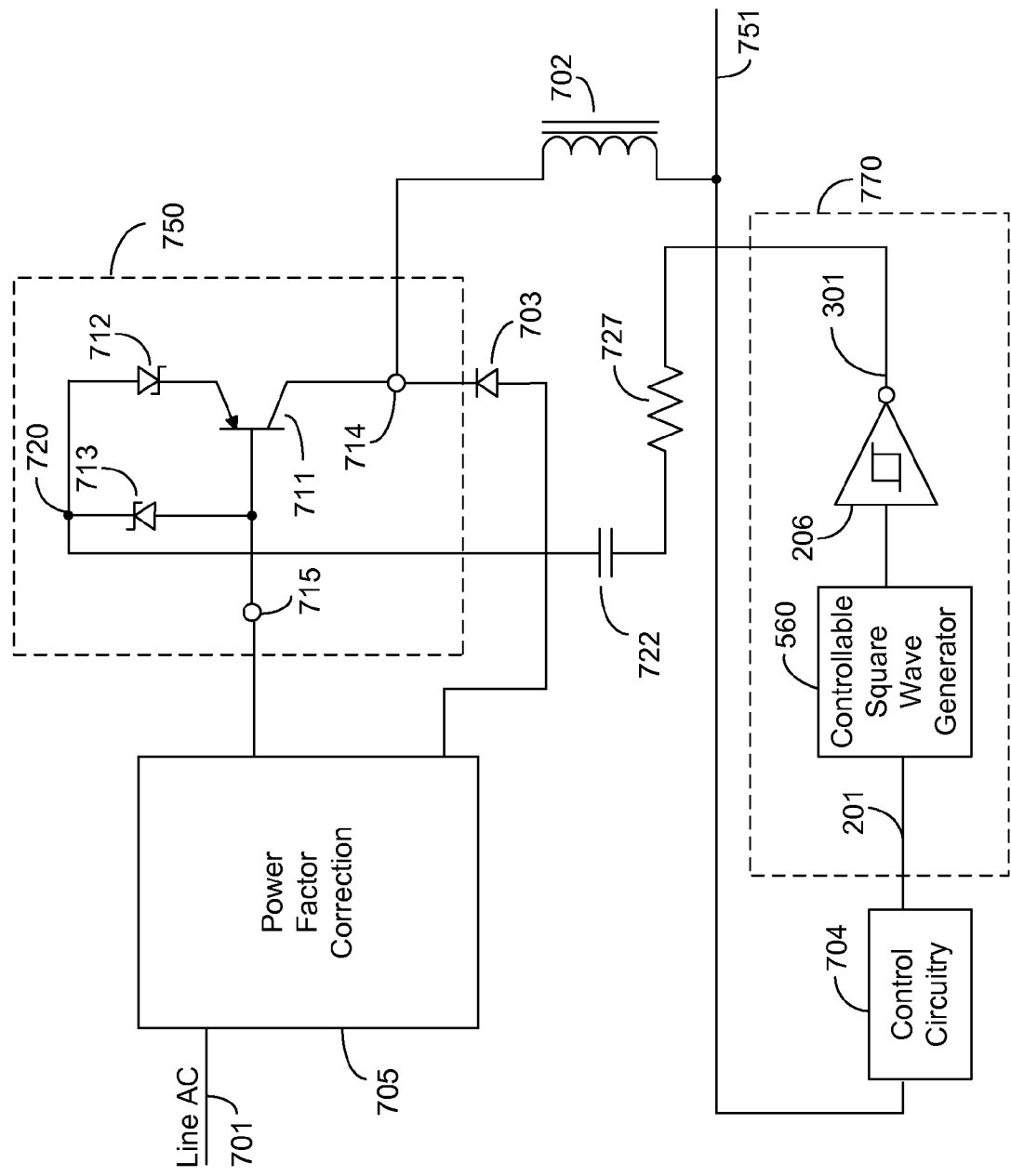
FIG. 7B is a circuit block diagram of a half wave, unipolar, high voltage switch with a half wave charge pump driver circuit used in a buck switching regulator according to embodiments of the present invention.

FIG. 7B is another buck regulator circuit that uses a PNP junction transistor 711 as a high voltage switch 750 according to embodiments of the present invention. High voltage switch 750 is driven by a controllable alternating current signal source, namely a driver 770 comprising a controllable square wave generator 560, receiving a control signal 201 as an input, and feeding an inverter 206 to generate an output 301. Output 301 is fed via a resistor 727 to a capacitor 722. In one non-limiting embodiment driver 770 is implemented as driver 300 of FIG. 3. High voltage switch 750 is illustrated using a PNP transistor 711, and differences in operation between high voltage switch 350 of FIG. 3 are hereinto explained.

High voltage switch 750 comprises a PNP junction transistor 711 as the active switch device with its collector terminal associated with, and coupled as, a negative switch terminal 714 and its base terminal associated with, and coupled as, a positive switch terminal 715. A pair of fast recovery diodes 712, 713 are connected in series and coupled between the emitter and the base terminals of PNP junction transistor 711, with the cathode of fast recovery diode 712 coupled to the emitter terminal of PNP junction transistor 711 and the anode of fast recovery diode 713 coupled to the base terminal of PNP junction transistor 711. A first end of a capacitor 722 is coupled to a common terminal defined between the anode of fast recovery diode 712 and the cathode of fast recovery diode 713, denoted terminal 720. A second end of capacitor 722 is coupled to output 301 of driver 770 via resistor 727.

Resistor 727 limits the current through capacitor 722 at the steep rising and falling edges of the drive waveform. While it is shown as a separate element, it may be the internal output resistance of inverter 206. During the negative half cycle of the drive waveform appearing at output 301, terminal 720 is driven to a voltage equal to the voltage at positive switch terminal 715, equivalent to the base of PNP junction transistor 711, minus the forward drop across diode 713. During the positive half of the drive waveform appearing at output 301, the voltage at the input side of capacitor 722 changes by +5V. During the same positive half cycle, the voltage appearing on the output side of capacitor 722, at terminal 720, changes from the voltage at positive switch terminal 715 plus a forward diode voltage drop to the voltage at positive switch terminal 715 plus a base-emitter forward drop, plus the forward drop across fast recovery diode 712. Thus a change in voltage of +5V on one side of the capacitor 722 results in a voltage change on the other side of capacitor 722 of approximately +1.9V. The change in charge necessary to reconcile this discrepancy is driven into the emitter terminal of transistor 711, and is available to the load, shown as inductor 702, at the collector terminal. This action recurs once per cycle of the oscillator, and the charge times the frequency is the available current. Available current can be controlled by sizing the capacitance of 722 and/or by setting the frequency of controllable square wave generator 560. The drive current supplied through capacitor 722 flows in a closed path. The return side of this path is through the common return of drive circuit 770 and power factor correction circuit 705. A control circuit 704 is connected to sense the voltage across inductor 702. When control circuit 704 determines the output is at a desired level, by sensing the voltage at inductor 702, denoted terminal 751, the controller causes control signal 201 to go low. Switch 150 is thereby turned off and the current in inductor 702 turns on a fly back diode 703 connected between the return of power factor correction circuit 705 and negative switch terminal 714 to continue current flowing to the load until switch 150 is turned back on.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein. All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

What is claimed is:

1. A high voltage switch circuit for coupling current from a first switch terminal to a second switch terminal comprising:
   a first junction transistor having a collector terminal associated with the first switch terminal, a base terminal associated with the second switch terminal, and an emitter terminal;
   a first diode having a first terminal coupled to the emitter terminal of said first junction transistor and a second terminal coupled to the base terminal of said first junction transistor, said first diode arranged to enable a unidirectional path for current flow between said first switch terminal and said second switch terminal via said first junction transistor in the event of a forward bias current between said base terminal and said emitter terminal of said first junction transistor; and
   a controllable alternating current signal source exhibiting an active mode and a inactive mode coupled to said first junction transistor and arranged in said active mode to alternatingly develop said forward bias current and a reverse bias between said base terminal of said first junction transistor and said emitter terminal of said first junction transistor.

2. A high voltage switch according to claim 1, wherein when said reverse bias is developed said unidirectional current flow is disabled after depletion of charge stored in said first junction transistor.

3. A high voltage switch according to claim 2, wherein said controllable alternating current signal source exhibits a frequency such that said alternatingly developed reverse bias does not disable said unidirectional current flow.

4. A high voltage switch according to claim 1, wherein when said controllable alternating current signal source exhibits said inactive mode, said unidirectional current flow is disabled after depletion of charge stored in said first junction transistor.

5. A high voltage switch according to claim 1, further comprising a transformer coupling said controllable alternating current signal source to said first junction transistor, said transformer exhibiting a secondary winding arranged in series with said first diode between said emitter terminal and said base terminal of said first junction transistor.

6. A high voltage switch according to claim 5, wherein said first switch terminal is directly coupled to said collector terminal of said first junction transistor and said second switch terminal is directly coupled to said base terminal of said first junction transistor.

7. A high voltage switch according to claim 5, further comprising a second junction transistor having a collector terminal associated with said second switch terminal, said base terminal of said first junction transistor being coupled to said second switch terminal via the base collector junction and said collector terminal of said second junction transistor.

8. A high voltage switch according to claim 7, wherein the base terminal of said second junction transistor is connected to said base terminal of said first junction transistor and the emitter terminal of said second junction transistor is connected to said emitter terminal of said first junction transistor.

9. A high voltage switch according to claim 1, further comprising:

a center tapped transformer coupling said controllable alternating current signal source to said first junction transistor, said center tapped transformer comprising a first secondary winding and a second secondary winding each having an end commonly connected to a center tap; and a second diode having a first terminal coupled to the emitter terminal of said first junction transmitter and a second terminal coupled to the base terminal of said first junction transistor;

said center tap of said center tapped transformer being coupled to said base terminal of said first junction transistor, said first winding being arranged in series with said first diode thereby coupling said second terminal of said first diode to said base terminal of said first junction transistor, and said second winding being arranged in series with said second diode thereby coupling said second terminal of said second diode to said base terminal of said first junction transistor.

10. A high voltage switch according to claim 9, further comprising a second junction transistor having a collector terminal coupled to said second switch terminal, said base terminal of said first junction transistor being coupled to said second switch terminal via the base collector junction and said collector terminal of said second junction transistor.

11. A high voltage switch according to claim 10, wherein the base terminal of said second junction transistor is connected to said base terminal of said first junction transistor and the emitter terminal of said second junction transistor is connected to said emitter terminal of said first junction transistor.

12. A high voltage switch according to claim 1, further comprising:
a second diode arranged in series with said first diode, said second terminal of said first diode being coupled to said base terminal of said first transistor via said second diode, said unidirectional path for current flow proceeding via said second diode; and
a capacitor having a first end coupled to said controllable alternating current signal source and a second end coupled to said second terminal of said first diode.

13. A high voltage switch according to claim 1, further comprising:
a second diode arranged in series with said first diode, said second terminal of said first diode being coupled to said base terminal of said first transistor via said second diode, said unidirectional path for current flow proceeding via said second diode;
a first capacitor having a first end coupled to a first output of said controllable alternating current signal source and a second end coupled to said second terminal of said first diode;
a third diode and a fourth diode connected in series, said third diode having a first terminal coupled to said emitter terminal of said first junction transistor and a second terminal coupled to a first terminal of said fourth diode, said second terminal of said fourth diode coupled to said base terminal of said first transmitter, said third and fourth diodes arranged to enable a unidirectional path for current flow between said first switch terminal and said second switch terminal via said first junction transistor in the event of a forward bias current between said base terminal and said emitter terminal of said first junction transistor; and
a second capacitor having a first end coupled to a second output of said controllable alternating current signal source and a second end coupled to said second terminal of said first diode, said second output of said controllable alternating current signal source being complementary to said first output.

14. A high voltage switch according to claim 1, further comprising a control circuit arranged to determine a condition of a load coupled between said first switch terminal and said second switch terminal, said controllable alternating current signal source being responsive to said control circuit to alternatively exhibit one of said active mode and said inactive mode responsive to said determined condition of said load.

15. An H-bridge circuit for driving a load comprising:
a first, second, third and fourth high voltage switch each exhibiting a first switch terminal and a second switch terminal;
a load exhibiting a first power lead and a second power lead;
a high voltage direct current source;
a first and a second controllable alternating current signal source, each of said first and second controllable alternative current signal sources exhibiting an active mode and a inactive mode, said first controllable alternating current signal source being in said inactive mode when said second controllable alternating current signal source is in said active mode, said second controllable alternating current signal source being in said inactive mode when said first controllable alternating current signal source is in said active mode,
said first high voltage switch and said second high voltage switch being arranged to enable a unidirectional flow of current from said high voltage direct current source to said first power lead of said load and return via said second power lead of said load when said first controllable alternating current signal source is in said active mode,
said third high voltage switch and said fourth high voltage switch being arranged to enable a unidirectional flow of current from said high voltage direct current source to said second power lead of said load and return via said first power lead of said load when said second controllable alternating current signal source is in said active mode.

16. An H-bridge circuit according to claim 15, wherein at least one of said first, second, third and fourth high voltage switches comprises:
a junction transistor having a collector terminal coupled to said first switch terminal, a base terminal coupled to said second switch terminal, and an emitter terminal; and
a diode having a first terminal coupled to the emitter terminal of said junction transistor and a second terminal coupled to the base terminal of said junction transistor, said diode arranged to enable a unidirectional path for current flow between said first switch terminal and said second switch terminal via said junction transistor in the event of a forward bias current between said base terminal and said emitter terminal of said junction transistor,
said respective one of said first and second controllable alternating current signal source arranged in said active mode to alternatingly develop said forward bias current and a reverse bias between said base terminal of said junction transistor and said emitter terminal of said junction transistor.

17. An H-bridge circuit according to claim 16, wherein said load comprises a cold cathode fluorescent lamp.

18. An H-bridge circuit according to claim 16, wherein when said reverse bias is developed said unidirectional current flow is disabled after depletion of charge stored in said junction transistor, and wherein each of said first and second controllable alternating current signal source exhibits a frequency such that said alternatingly developed reverse bias does not disable said unidirectional current flow.

19. An H-bridge circuit according to claim 15, wherein said load comprises a cold cathode fluorescent lamp.

20. A method of powering a load comprising:
proving a junction transistor;
providing a diode;
providing a controllable alternating signal source;
arranging said junction transistor in a common base arrangement with respect to a load and said provided controllable alternating signal source, said controllable alternating signal source thereby alternatingly forward biasing and reverse biasing the base emitter junction of said provided junction transistor;
arranging said diode between the emitter and the base of said provided junction transistor; and
setting the frequency of said controllable alternating signal source such that a collector-emitter current continues to flow during the period when the base emitter junction of said bipolar transistor is reverse biased by said controllable alternating signal source.

* * * * *